United States Patent
Bazylenko et al.

(10) Patent No.: US 6,650,816 B2
(45) Date of Patent: Nov. 18, 2003

(54) PLANAR WAVEGUIDE AMPLIFIER

(75) Inventors: Michael Bazylenko, Eveleigh (AU); Geoffrey Lester Harding, Eveleigh (AU)

(73) Assignee: Redfern Integrated Optics Pty Ltd,, Sydney (AU)

( * ) Notice: Subject to any disclaimer, the term of this patent is extended or adjusted under 35 U.S.C. 154(b) by 50 days.

(21) Appl. No.: 09/900,438

(22) Filed: Jul. 6, 2001

(65) Prior Publication Data

US 2003/0007763 A1 Jan. 9, 2003

(51) Int. Cl.$^7$ .............. G02B 6/10; G02B 6/12; H01S 3/00
(52) U.S. Cl. .......... 385/129; 385/130; 385/131; 385/14; 359/342; 359/345; 359/333
(58) Field of Search ................. 385/129, 130, 385/131, 14, 49; 65/385, 386; 359/333, 342, 343, 345, 346

(56) References Cited

U.S. PATENT DOCUMENTS

| 4,904,037 | A | * | 2/1990 | Imoto et al. ............ 385/14 |
| 5,563,979 | A | | 10/1996 | Bruce |
| 5,600,745 | A | * | 2/1997 | Wuu et al. .............. 385/49 |
| 5,607,559 | A | | 3/1997 | Yamada |
| 5,841,928 | A | * | 11/1998 | Maxwell et al. ......... 385/129 |
| 5,847,865 | A | | 12/1998 | Gopinath |
| 5,940,568 | A | * | 8/1999 | Losch ................... 385/129 |
| 5,985,104 | A | * | 11/1999 | Westwood ............ 204/192.15 |
| 6,208,791 | B1 | * | 3/2001 | Bischel et al. ........... 385/129 |

FOREIGN PATENT DOCUMENTS

GB    2276635    10/1994

* cited by examiner

*Primary Examiner*—Georgia Epps
*Assistant Examiner*—Jack Dinh

(57) ABSTRACT

The present invention provides a planar optical waveguide amplifier for amplifying optical communications signals when optically pumped by radiation of a pumping wavelength, the amplifier comprising: an optical buffer layer formed on a substantially planar substrate; an optically-transmissive metal-oxide-based waveguide core formed on the buffer layer, the core comprising aluminium oxide and a gain medium; and an optical cladding layer formed over the core. Preferably, the composition of the core predominantly comprises aluminium oxide and the gain medium comprises erbium and/or ytterbium. The waveguide core can be formed by reactively dc sputtering aluminium. The invention has the advantage of allowing higher erbium doping concentrations than is possible for silica-based amplifiers.

47 Claims, 5 Drawing Sheets

PLANAR WAVEGUIDE AMPLIFIER

TECHNICAL FIELD

The present invention relates to active optical amplifiers in the form of planar optical waveguides.

BACKGROUND OF THE INVENTION

Optical amplifiers are an important component in optical networks for distributing optical signals. In recent years, erbium-doped optical fibres have been developed which have the capability of amplifying an optical signal. In order to amplify an optical communications signal propagating in an erbium-doped fibre amplifier, light of a different wavelength is coupled into the fibre from a pumping laser. The pumping laser stimulates electronic transitions which amplify the communications signal as it passes through the erbium-doped optical fibre.

In applications where optical components need to be relatively small and device integration is desirable, it is advantageous to provide an optical amplifier in the form of a planar waveguide integrated on a single substrate. However, there are difficulties in integrating erbium-doped amplifiers. In particular, since the longitudinal dimensions of integrated amplifiers tend to be much smaller than the longitudinal dimensions of erbium-doped fibre amplifiers, it is necessary to increase the gain of the amplifier. Attempts have been made to increase the gain by increasing the percentage of erbium. However, the gain in erbium-doped fibre amplifiers has been found to decrease when the erbium doping concentration exceeds a critical level. For example, in silica-based amplifiers, maximum gain is achieved with an erbium concentration of around 0.01–0.02 atomic %. It is believed that at higher concentrations of erbium, the gain is reduced due to an increase in erbium-erbium interactions. One method of addressing this problem has been to increase the solubility of erbium in silica-based glass by incorporating various glass modifiers into the structure, such as sodium and calcium. However, this approach has had limited success, particularly when the core layer of the waveguide is deposited by sputter deposition.

Sputter deposition involves bombarding a target of source material in a manner which ejects electrons and target atoms from the target and deposits at least some of the ejected target atoms onto a substrate. In configurations where a magnet is positioned beneath the target so as to increase plasma densities closer to the target, the technique is referred to as magnetron sputtering. One of the characteristics of sputter film deposition is that different species of target atoms tend to have different deposition rates due to differences in gas scatter rates and substrate sticking coefficients. Thus, a film deposited from a composite target containing a number of different atomic species (e.g. silica, erbium, sodium and calcium) can have a composition which is different to that of the composite target. There is therefore a need for an optical planar waveguide amplifier which has an improved gain, and for an improved method of fabricating the optical planar waveguide amplifier.

SUMMARY OF THE INVENTION

In accordance with a first aspect of the present invention, there is provided a planar optical waveguide amplifier for amplifying optical communications signals when optically pumped by radiation of a pumping wavelength, the amplifier comprising:

an optical buffer layer formed on a substantially planar substrate;

an optically-transmissive metal-oxide-based waveguide core formed on the buffer layer, the core comprising aluminium oxide and a gain medium; and an optical cladding layer formed over the core.

The aluminium oxide may comprise at least 50 mol % of the core. Preferably, aluminium oxide comprises at least 70 mol % of the core. Preferably, the composition of the core predominantly comprises aluminium oxide. In one embodiment, aluminium oxide comprises at least 80 mol % of the core.

The gain medium may comprise one or more lanthanide species such as erbium or ytterbium. In one embodiment, the gain medium comprises both erbium and ytterbium. The inventors have recognised that the solubility of erbium in aluminium oxide is greater than in silica-based materials. Thus, where the gain medium comprises erbium, the present invention has the advantage of enabling higher core concentrations of erbium to be attained than is possible with silica-based cores. The concentration of erbium in the core may be at least 0.1 atomic %, up to a maximum of about 1.0 atomic %. By comparison, known silica-based amplifying cores are doped with a maximum of about 0.01–0.02 atomic % of erbium. In one embodiment, the concentration of erbium in the core is between 0.05 and 0.5 atomic %.

The core may optionally comprise a gain-broadening dopant for broadening a gain spectrum of the amplifier. For example, the gain-broadening dopant may comprise, but is not limited to, fluorine, tellurium, sodium or calcium. The core may optionally comprise at least one refractive-index-modifying dopant, such as fluorine. The core may further comprise a dopant capable of reducing interactions between atoms of the gain medium which decrease the potential gain of the amplifier. For example, where the gain medium comprises erbium, the core may be doped with fluorine to reduce erbium-erbium interactions and to decrease the refractive index of the core.

Preferably, the buffer layer and cladding layer each have a refractive index which is lower than a refractive index of the core, so as to optically isolate the core. The cladding layer and buffer layer may each comprise silica-based materials. The cladding layer and/or buffer layer may comprise a core of another planar waveguide. For example, the amplifier core may be disposed within a silica-based core of another waveguide in order to couple optical signals between the two waveguides.

The core may comprise a material which has been deposited by sputtering, preferably by dc sputtering. The core may have been annealed so as to reduce the amount of defects or impurities which could potentially cause absorption at a wavelength of the communications signal, or non-radiative energy transfer from the gain medium.

The substrate may comprise a wafer of silicon and may incorporate one or more over-layers of material formed upon it. For example, another waveguide may be interposed between the silicon wafer and the amplifier.

In accordance with a second aspect of the present invention, there is provided a method of fabricating a planar optical waveguide amplifier for amplifying optical communications signals when optically pumped by radiation of a pumping wavelength, the method comprising:

forming an optical buffer layer on a substantially planar substrate;

forming an optically transmissive metal-oxide-based waveguide core on the buffer layer, the core comprising aluminium oxide and a gain medium; and forming an optical cladding layer over the core.

The step of forming the metal-oxide-based core may comprise depositing a metal-oxide based core layer on the buffer layer and shaping the core layer so as to form the waveguide core by means of lithographically-defined etching. The core may have a channel geometry.

The gain medium may comprise one or more lanthanide species such as erbium and/or ytterbium.

The core layer may be deposited by sputtering. The sputtering may be carried out in a sputtering atmosphere containing a noble gas. Preferably, the core layer is deposited by reactive dc sputtering, and most preferably, by reactive dc magnetron sputtering in a sputtering atmosphere containing oxygen. An advantage of dc sputtering is that it can achieve a higher deposition rate than is possible with rf sputtering, and dc magnetron sputtering achieves an even higher deposition rate than conventional dc sputtering. The sputtering atmosphere may further comprise an additional reactive gas capable of incorporating a refractive-index-modifying dopant, such as fluorine, in the deposited core layer. The additional reactive gas may comprise a fluorine-containing gas suitable for incorporating fluorine into the core layer, and may comprise carbon tetrafluorine ($CF_4$). Where the reactive gas contains fluorine, the refractive index of the deposited core layer may be reduced through a formation of aluminium oxyfluorine. A sputtering target used to deposit the core layer may be fluorinated during the deposition to an extent sufficient to increase a sputtering rate of the target and to incorporate fluorine in the core layer. Alternatively, or in addition, the core layer may be fluorinated directly as it grows. The fluorination may be carried out by cyclically flowing a fluorine-containing gas over the target or core layer and then halting the flow of the fluorine-containing gas in a manner which prevents total fluorination (i.e. conversion to $AlF_3$) of the entire core layer. Thus, the core layer may be in the form of a multilayered structure in which the concentration of fluorine changes from layer to layer, preferably periodically, resulting in an average refractive index which is lower than that of pure aluminium oxide.

The core layer may also be formed by simultaneously dc sputtering two targets of aluminium, only one of which is fluorinated, so as to incorporate material sputtered from both targets into the core layer. Preferably, the substrate is exposed to only one of the two targets at a time, for example by cyclically moving the substrate from one target to the other using a substrate rotation stage. Alternatively, the core layer may be formed by simultaneously exposing the substrate to both targets. Preferably, the core layer is deposited by reactively dc sputtering at least one metallic target containing aluminium in a sputtering atmosphere containing oxygen. The ratio of aluminium to gain medium in the core layer can be controlled by controlling the atomic composition of a sputter surface of each target. The gain medium may be disposed throughout the aluminium so as to form an alloy. Alternatively, the gain medium may be concentrated in at least one local region with an aluminium target. For example, the target can comprise an aluminium plate holding at least one plug of gain medium. In a further alternative, the target may comprise a laminate structure consisting of a layer of gain medium, such as erbium or ytterbium, disposed directly behind and in contact with a layer of aluminium, wherein the layer of aluminium includes openings through which the layer of gain medium is exposed during the deposition. The ratio of sputtered aluminium to sputtered erbium can be controlled by controlling the size and number of openings in the aluminium target layer.

The reactive dc sputtering is preferably carried out such that there is a level of ion bombardment at the target surface which is sufficient to prevent surface passivation (i.e. oxide formation) of the gain medium in each target. Where the sputtering atmosphere comprises oxygen mixed with a noble gas, such as argon, the gas flows of oxygen and the noble gas are preferably arranged so as to reduce or prevent oxidation of the exposed target surface. In one embodiment, a noble-gas outlet is provided adjacent the target surface and an oxygen outlet is provided adjacent the substrate surface, so as to produce a higher partial pressure of oxygen at the substrate than at the target surface.

The buffer and cladding layers may comprise silica-based layers and at least one of the buffer layer and cladding layer may be deposited by plasma-enhanced chemical vapour deposition (PECVD). Preferably, each silica-based layer is deposited in the absence of nitrogen or nitrogen-containing gases. Silica-based material which is deposited in this way has the advantage of exhibiting reduced optical absorption in the wavelength range from 1.50 $\mu$m to 1.55 $\mu$m due to the absence of a nitrogen-induced absorption peak in this region. A liquid source of precursor may be used in the plasma-enhanced chemical vapour deposition to form each silica-based layer. The liquid source of precursor may comprise tetra ethyl oxysilane.

The method may further comprise annealing the core layer and/or core in a manner which reduces, and preferably substantially eliminates, defects and impurities which could potentially cause absorption at a wavelength of the optical signal. The core layer and/or core may be annealed in a manner which reduces, and preferably substantially eliminates, defects and impurities which could potentially cause non-radiative energy transfer from excited atoms of the gain medium.

In accordance with a third aspect of the invention, there is provided a planar optical waveguide amplifier for amplifying optical communications signals when optically pumped with radiation of pumping wavelength, the amplifier comprising:

an optical buffer layer;

an optically-transmissive waveguide core formed on the buffer layer, the core comprising a film of material deposited by reactive dc sputtering; and, an optical cladding layer formed over the core.

The core may comprise an optically-transmissive metal oxide such as aluminium oxide or titanium dioxide. Alternatively, the core may comprise an optically-transmissive chalcogenide compound, such as zinc oxide or zinc sulfide.

It is to be understood that, if any prior art publication is referred to herein, such reference does not constitute an admission that the publication forms a part of the common general knowledge in the art, in Australia or any other country.

For the purposes of this specification it is to be clearly understood that the word "comprising" means "including but not limited to", and that the word "comprises" has a corresponding meaning.

BRIEF DESCRIPTION OF THE DRAWINGS

Embodiments of invention will now be described, by way of example only, with reference to accompanying drawings.

DETAILED DESCRIPTION OF THE DRAWINGS

Figure 1:
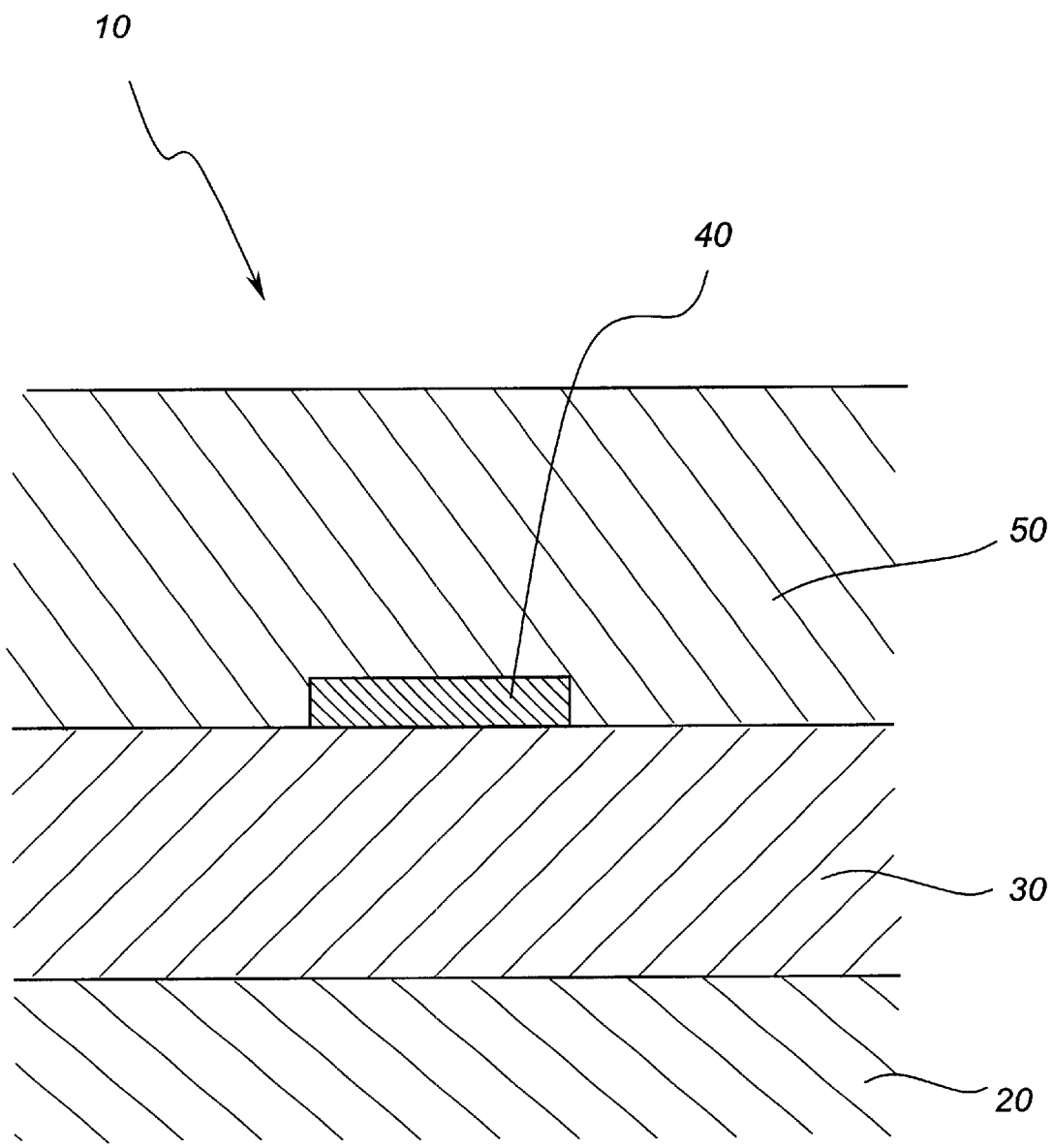
FIG. 1 is a cross-sectional view of an embodiment of an optical planar waveguide amplifier.
Figure 2:
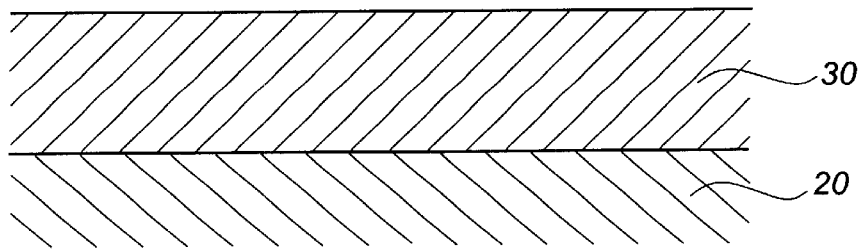
FIGS. 2 to 5 show the amplifier of FIG. 1 at four stages of fabrication.

FIG. 1 shows a cross-sectional view of an embodiment of a planar optical waveguide amplifier 10 in accordance with the present invention. The amplifier 10 comprises a substrate 20, a buffer layer 30 formed on the substrate, a core 40 deposited on the buffer layer 30, and a cladding layer 50 arranged over the core and buffer layer. The buffer layer 30, core 40 and cladding layer 50 are each formed from optically-transmissive materials. The buffer layer 30 and cladding layer 50 each have a refractive index which is lower than a refractive index of the core 40 in order to optically isolate the core.

In this embodiment, the buffer and cladding layers 30,50 comprise silicon dioxide ($SiO_2$) and the substrate 20 comprises a wafer of silicon. The core 40 mainly comprises aluminium oxide ($Al_2O_3$) but includes a number of other constituents in smaller quantities to modify the physical properties of the aluminium oxide. In order for the aluminium oxide core to amplify light, it must be doped with a gain medium such as erbium and/or ytterbium. In this embodiment, the core is doped with erbium atoms at a concentration of 0.5 atomic %, but the core can be co-doped with ytterbium. It should be noted that other doping levels can be used. The concentration of erbium can be in the range from 0.1 atomic % to 1.0 atomic %, and the concentration of ytterbium should be roughly 5 to 10 times the erbium concentration i.e. in the range from 0.5 atomic % to 10 atomic %. In general, the concentration of erbium and/or ytterbium should be selected to maximise the gain of the amplifier. Other constituents which can be added to the aluminium oxide core 40 are discussed in more detail below.

The core 40 can have any one of a range of different dimensions, depending on whether the application requires the core to support a single mode or multiple modes. Many applications require the core to support a single mode at the wavelength of the optical signal to be amplified, typically around 1.55 $\mu$m. In order to guide the fundamental mode alone, the core dimensions will depend on the wavelength of the signal and the refractive index of the core material. For example, for a wavelength of 1.55 $\mu$m and a core refractive index of 1.6, the core width should be no greater than 2 $\mu$m and the height should be no greater than 0.8 $\mu$m. The thicknesses of the buffer and cladding layers 30, 50 are less critical, but are advantageously in the range from 10 $\mu$m to 20 $\mu$m.

The amplifier fabrication method will now be described with reference to FIGS. 2–6. Firstly (FIG. 2), the silicon dioxide buffer layer 30 is deposited on a silicon substrate 20 by plasma-enhanced chemical vapour deposition. Advantageously, the silica buffer layer 30 is fabricated in accordance with the method described in Australian provisional patent application number PR1782, the disclosure of which is hereby incorporated by reference. However, it will be understood that other known methods of depositing the silica buffer layer 30, such as thermal oxidation of a silicon substrate, can be used instead.

Figure 3:
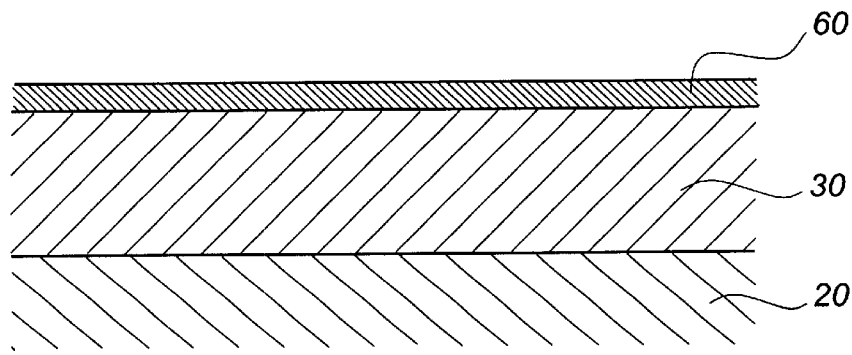
Figure 4:
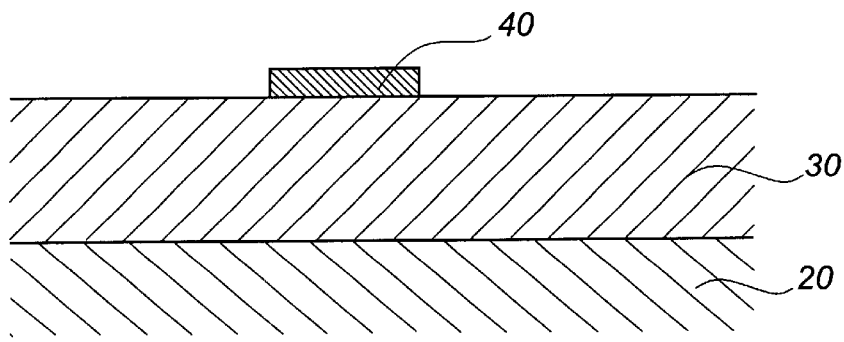
Figure 5:
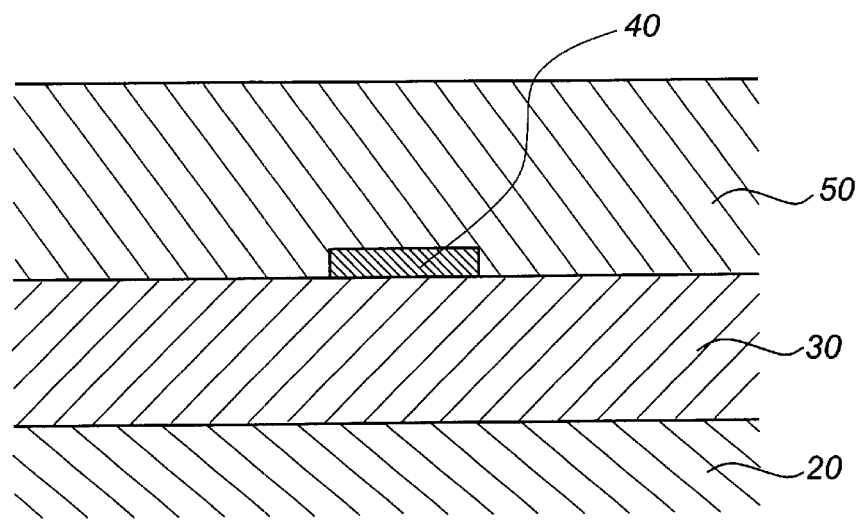

Referring to FIG. 3, a layer 60 of core material is then deposited over the buffer layer 30 by reactive dc sputter deposition. The process of sputter deposition is described in detail below. Once the core layer 60 has been deposited, the substrate 20 is removed from the sputter deposition chamber 80 and the core layer is shaped laterally into the desired core structure 40 (see FIG. 4) by known photo-lithographic etching procedures. In this embodiment, the core 40 is a channel waveguide. Finally (FIG. 5), once the core 40 has the desired shape, the cladding layer 50 is deposited over the buffer layer 30 and core 40 by PECVD using the same procedure as was used to form the buffer layer 30.

The amplifier 10 can be integrated on the same substrate 20 with other planar waveguides, such as silica-based waveguides. For example, U.S. Pat. No. 6,549,688 entitled "Monolithically Integrated Optical Device and Method of Forming Same" discloses a metal-oxide-based planar waveguide monolithically integrated with at least one other planar waveguide. The disclosure of said co-pending patent application is hereby specifically incorporated by cross-reference.

Although the core 40 shown in FIG. 1 has a simple channel waveguide geometry, the core can be formed with any configuration necessary. For example, in order to couple signals into and out of the amplifier, it may be necessary to taper the dimensions and/or refractive index at terminal ends of the amplifier. The amplifier 40 may be coupled to other waveguides using any one of the waveguide configurations disclosed in U.S. patent application Ser. No. 09/900,418 and U.S. patent application Ser. No. 09/900,630, both entitled "A Photonic Signal Transmitting Device", the disclosures of which are hereby specifically incorporated by cross-reference.

Figure 6:
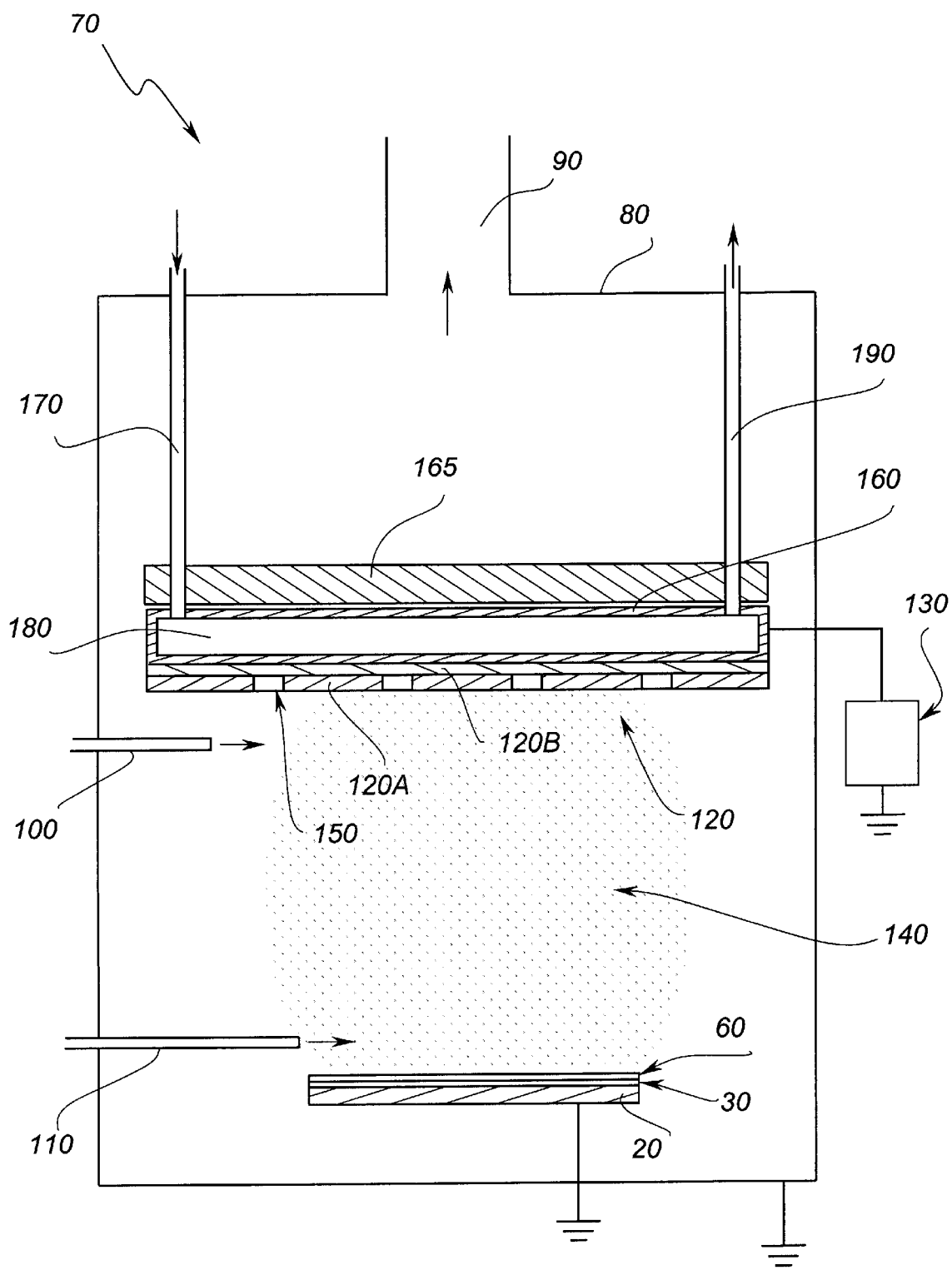
FIG. 6 schematically shows a cross-sectional view of an embodiment of a sputter deposition system suitable for forming a core layer in a planar waveguide amplifier.

A schematic diagram of a sputter deposition system 70 suitable for forming the core layer 60 is shown in FIG. 6. The magnetron sputter deposition system 70 is enclosed in a vacuum chamber 80 evacuated by a vacuum pump (not shown) through a pump port 90. The vacuum chamber 80 includes two gas inlet ports 100, 110 for supplying sputtering gases to the chamber 80 during the deposition. The substrate 20 is held in the vacuum chamber 80 such that the buffer layer 30 faces a target 120 of source material for forming the core layer 60. A power supply 130 applies a negative dc bias to the target, typically in a range from −300 V to −1000 V dc. Once the bias voltage is applied to the target and a sputtering atmosphere is input into the chamber through the gas inlets 100, 110 (typically around 1.0 Pa) a plasma discharge 140 forms in front of the target 120. The sputtering discharge is self-sustaining and arises when positively ionised gas species collide with the target 120 and begin an avalanche process by causing target atoms to be ejected. Electrons are also ejected from the target and these sustain the process by ionising further gas atoms. Some of the ejected target atoms are ejected towards the substrate and deposit over the buffer layer 30 and thus form the core layer 60. This process is continued until the deposited core layer 60 is of sufficient thickness.

In this embodiment, the target 120 is a bi-layer laminate comprising an aluminium layer 120A disposed in front of, but in contact with, an erbium layer 120B. The aluminium layer 120A includes a number of openings 150 which expose portions of the erbium layer 120B. The openings 150 in the aluminium layer 120A expose small regions of the erbium layer 120B to the sputtering discharge, causing erbium atoms to be sputtered through the openings and into the plasma discharge 140. Since both aluminium and erbium are exposed to ion bombardment from the discharge 140, the plasma contains aluminium, erbium, argon and oxygen. As the sputter rates of erbium and aluminium are unequal, the ratio of erbium to aluminium in the plasma will be different to the ratio of exposed aluminium target area to exposed erbium target area. However, once the relative sputter rates of erbium and aluminium are ascertained, the size and number of the openings 150 can be selected to compensate for the difference in sputter rates.

The laminate target 120 is held in close contact with a water-cooled electrode 160, which is in turn in close contact with a magnet 165 for confining the plasma discharge 140. A water inlet 170 allows cooled water to flow into a hollow chamber 180 inside the electrode and a water outlet 190 constantly extracts warmed water from the electrode chamber. The two gas inlet ports 100, 110 are used to introduce two types of sputtering gases into the chamber 80 during the deposition. The first inlet port 100, located adjacent the target 120, introduces argon, while the second gas inlet port 110 adjacent the substrate introduces oxygen. Without oxygen, the sputter discharge would deposit elemental aluminium and erbium. However, the presence of oxygen in the sputtering atmosphere allows the erbium and aluminium ions to oxidise and form an oxide film. It is desirable that the first gas inlet port 100 adjacent the target 120 supplies a noble gas, such as argon, in order to prevent oxidation at the surface of the aluminium and erbium targets. The reason is that any oxidation at the target surface changes the electrical characteristics of the target 120 which in turn causes undesirable changes in the sputter rate of the target. Although the argon and oxygen gases diffuse together to some extent, the gas composition closer to the target is much richer in argon than oxygen, and therefore minimises target oxidation. In this embodiment the flow rates of argon and oxygen into the chamber are 30.0 standard cubic centimetres per minute (sccm) and 2.5 sccm, respectively. In addition, a cylindrical shield (not shown) extending from around the target 120 towards the substrate can be used to concentrate argon in front of the target. By maintaining a high argon concentration near the target relative to the oxygen concentration, the mean free path between collisions is reduced near the target to impede the flow of oxygen toward the target.

The power supply 130 in this embodiment is quasi-dc as it includes a switching circuit which momentarily switches the negative target voltage to approximately +20 volts at a frequency of approximately 20 kHz. The power supply outputs the positive voltage for approximately 10% of the period of each switching cycle, and outputs the negative voltage for the remainder of the cycle. The positive voltage has the advantage of attracting electrons which neutralise any positive charges accumulating on oxidised areas of the target. A person skilled in the art will understand that the dc power supply 130 can also operate at other switching speeds, typically in the range from 5 kHz to 50 kHz. Alternatively, a purely dc power supply can be used instead.

The target configuration used in this embodiment has the advantage that the different sputter rates of two target species can be compensated for by controlling the size and number of openings 150. An alternative method is to use a single target of aluminium which is doped with erbium. However, in such a configuration the concentration of erbium can only be changed by using a new target in which the erbium concentration is different. An alternative method involves simultaneously sputtering two targets, which in the current example would be a first target of aluminium and a second target of erbium. In this method, the concentration of erbium in the growing aluminium oxide core layer can only be controlled after trial and error by adjusting the deposition conditions.

Although the target 120 in this embodiment is a bi-layer laminate of aluminium and erbium layers, the invention includes with in its scope a laminate in which additional target layers are also included. For example, a tri-layer laminate of aluminium, erbium and ytterbium layers can be used to deposit an aluminium core layer co-doped with erbium and ytterbium. In this case, openings are provided in the aluminium layer and to a lesser extent in the middle laminate layer in order to allow the rear laminate layer to be sputtered through both sets of openings. Alternatively, the laminate can comprise a bi-layer in which the front layer is aluminium and the rear layer comprises a partial layer of erbium joined to a partial layer of ytterbium. In this case, some of the openings in the aluminium layer expose erbium while the remaining openings expose ytterbium. A further embodiment of a target is described below with reference to FIGS. 8 and 9.

Various core-modifying chemical elements can be added to the core layer 60 during or after the deposition in order to increase the solubility of erbium, and thus to prevent clustering of erbium atoms at high concentrations. Certain modifiers have been found to increase erbium solubility while avoiding concentration-quenching effects, which would otherwise reduce the $Er^{3+}$ radiative lifetime at relatively high concentrations. Modifiers that are useful in this regard are alkaline metals such as sodium and alkaline earth metals such as calcium.

Modifiers are also usefully incorporated into the core to control the homogenous and inhomogeneous broadening of the $Er^{3+}$ absorption and emission peaks. Such modifiers include alkali and alkaline earth metals, which in at least some cases, tend to make the peaks narrower, and elements such as lanthanum, yttrium and zirconium, which contribute high fieldstrength ions and tend to broaden the peaks. It is believed that fluorine can also assist in the supression of erbium-erbium interactions. A further modifier, tellurium, can also be added to the core layer to broaden the gain spectrum.

Figure 7:
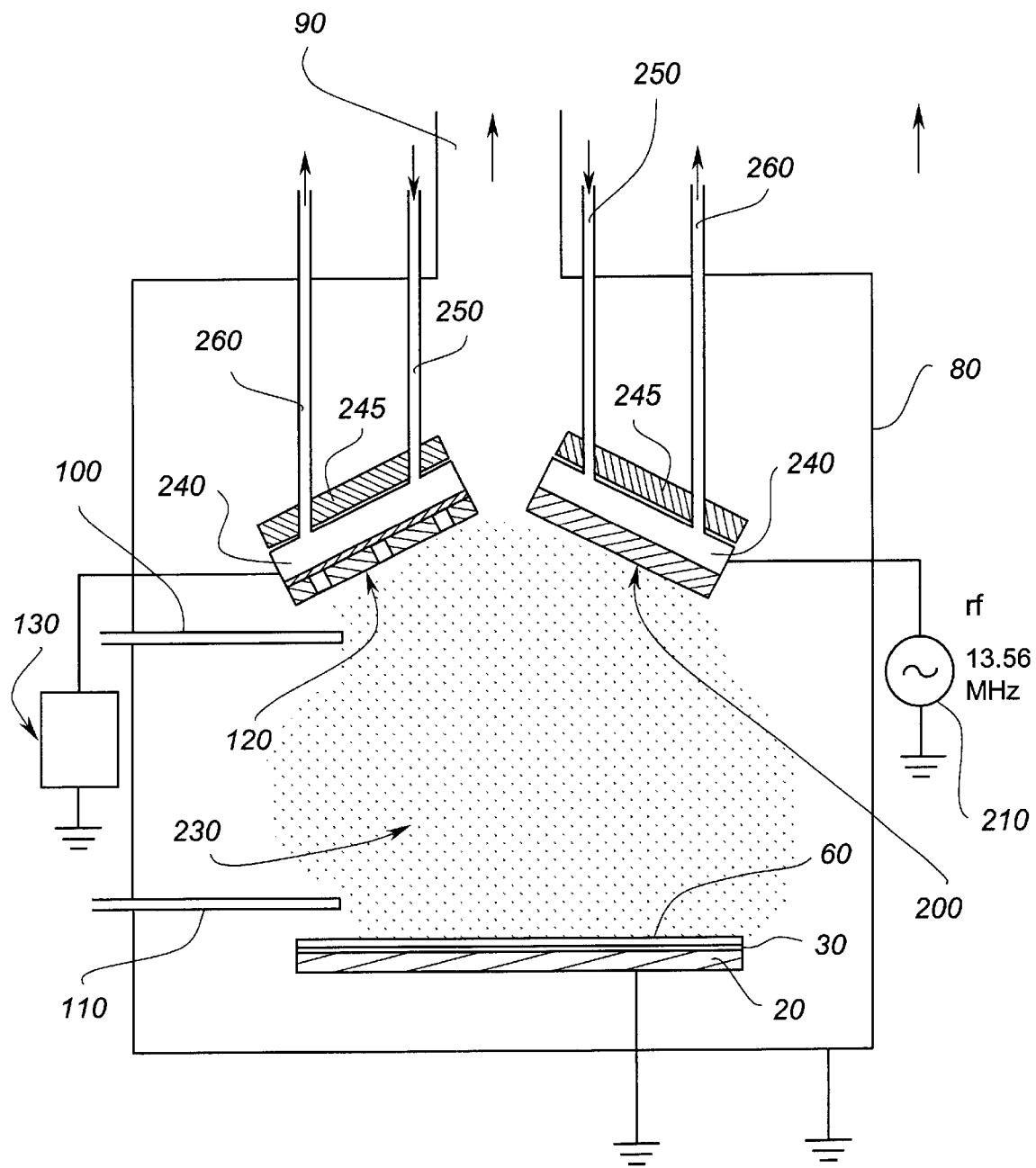
FIG. 7 schematically shows a cross-sectional view of an alternative embodiment of a sputter deposition suitable for forming a core layer.

All of the above modifiers can be incorporated into the core layer 60 during the sputter deposition process using a slightly modified deposition system as shown in FIG. 7. In this deposition system, there is a provision for two targets to be sputtered simultaneously so as to form a film which incorporates material sputtered from both targets. Corresponding numerals have been used in FIG. 7 where the features are the same as those in FIG. 6. In this embodiment, one of the targets 120 comprises a bi-layer laminate target identical to target 120 depicted in FIG. 6, while the second target 200 comprises an oxide target containing the various modifiers. The bi-layer laminate target 120 is reactively dc sputtered in order to take advantage of the high deposition rate achieved in dc sputtering. On the other hand, since the second target 200 containing the modifiers is an oxide, it is a dielectric which must be sputtered using a radio frequency (rf) power supply 210. The lower sputter rate inherent in RF sputtering is not problematic in this case as the second target 200 is used for doping purposes only. The sputter rate of the second target 200 can be controlled by changing the RF power level directed into the second target. The two targets 120, 200 are angled slightly toward each other and toward the centre of the substrate 20 so as to form a plasma 130 between the targets and substrate which is a substantially uniform mixture of material sputtered from both targets. As with the previous embodiment, both targets 120, 200 are mounted on water-cooled electrodes 240 which each include a water inlet 250 for letting in cool water and water outlet 260 for extracting warmed water. Also, each electrode 240 is mounted on a magnet 245.

Figure 8:
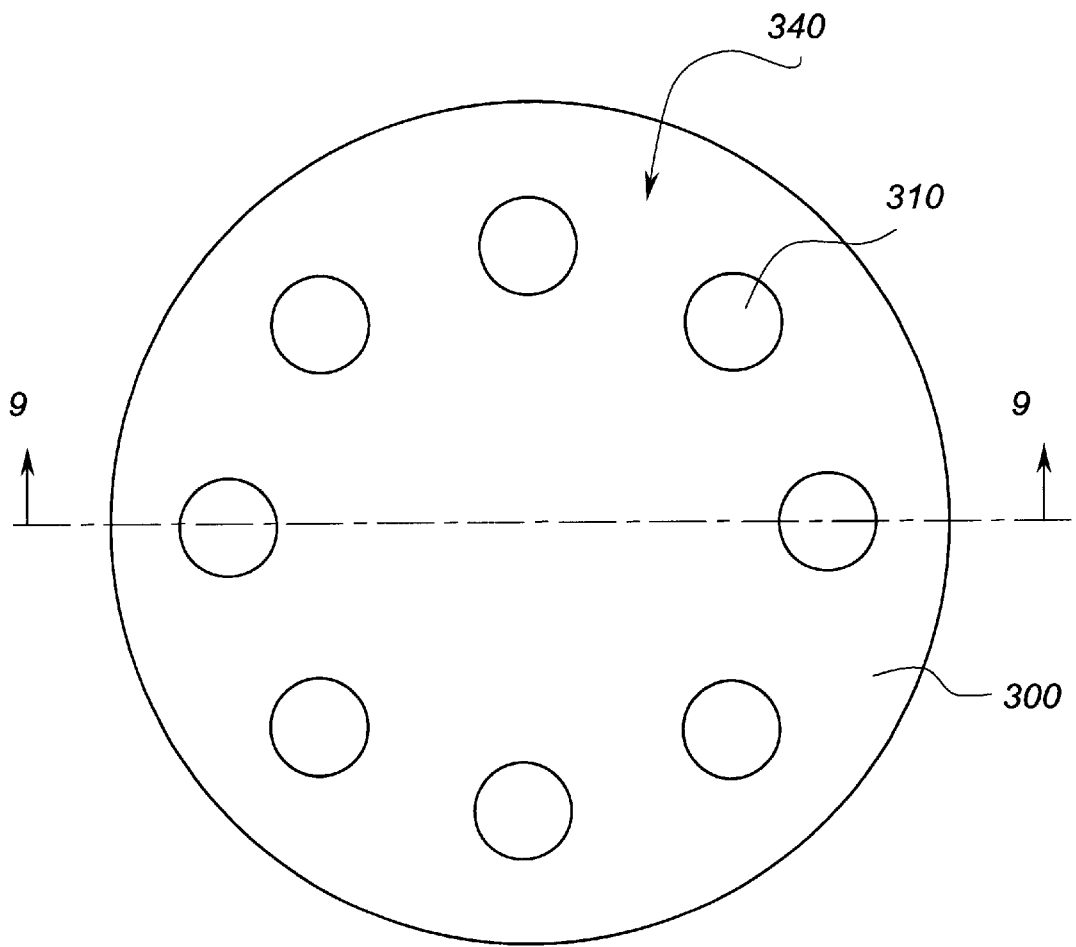
FIG. 8 is a plan view of a further embodiment of a sputter target.
Figure 9:
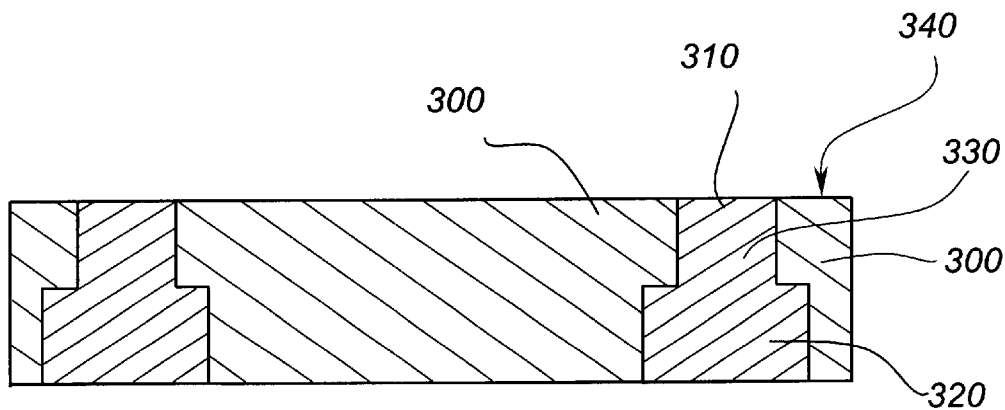
FIG. 9 is a cross-sectional view through section 9—9 of FIG. 8.

Another embodiment of a sputter target which can be used to deposit the core layer will now be described with reference to FIGS. 8 and 9. In this embodiment, the target comprises a disk of aluminium 300 having holes in which plugs of erbium 310 have been inserted in order to dope the growing core layer with erbium. Each erbium plug 310 is formed with a broad base 320 which holds the plug firmly in position, and a reduced-diameter upper portion 330 which is exposed at an upper surface 340. Each hole formed in the target has a shape which compliments and meshes with the erbium plugs 310 in order to hold each plug in place during use. This embodiment allows a thick target to be made which lasts a considerable period of time in a high-volume fabrication situation. Each of the erbium plugs 310 is located on a circular ring which is coincident with a sputter zone of the target as defined by a circular magnet (not shown) disposed beneath the target. The concentration of erbium in a sputtered core layer can be determined by varying the number of erbium plugs and the area of each plug exposed at the upper surface 340. It will be understood that plugs of other materials, such as ytterbium, may also be incorporated in the aluminium target 300.

Annealing

In the above embodiment, the aluminium oxide film was annealed at a temperature of 700°. However, it will be understood that the aluminium oxide film can also be annealed at a temperature in the range from 700° C. to 850° C. The annealing temperature for the aluminium oxide should not exceed 850° C. as recrystallisation of the aluminium oxide takes place at temperatures above this temperature. Although the annealing can be carried out in an oxygen-free atmosphere, such nitrogen or argon, the aluminium oxide is best annealed in an atmosphere which contains oxygen, such as air or pure oxygen, in order to ensure that the aluminium oxide does not become oxygen-deficient during the annealing. The annealing time is not critical, but is typically at least one hour.

The entire amplifier can be annealed in order to remove defects, alleviate stresses and to compensate for any oxygen deficiencies. However, as annealing can also promote interfacial mixing of the layers, it is preferable that an annealing step is carried out directly after each layer of the amplifier has been deposited. In other words, an annealing step can be carried out after each of the method steps: deposition of the buffer layer; deposition of the core layer; etching of the core layer; and deposition of the cladding layer. It has been found that annealing tends to reduce the refractive index of silica films deposited by PECVD. In order to compensate for this reduction in refractive index, silica films can be doped with a refractive index-increasing dopant, such as germanium oxide. For example, the buffer layer can be simultaneously deposited with germanium oxide during the PECVD process to an extent sufficient to compensate for any future annealing-induced decrease in refractive index.

EXAMPLE

A planar optical amplifier was fabricated on a silicon substrate. Firstly, a buffer layer comprising a 15-micron-thick layer of thermally grown silicon dioxide was formed. The core layer was then deposited by dc magnetron sputtering at a deposition rate of about 300 Ångstroms per minute. The core layer comprised a 0.7-micron-thick layer of aluminium oxide doped with 0.5 atomic % erbium and 5 atomic % ytterbium. The substrate temperature during the deposition was approximately room temperature.

The core layer was shaped into a channel waveguide with a width of 1.8 µm using photolithography and etching, and then annealed at a temperature of 700° C. in an atmosphere of air for a period of 2 hours. A 15-micron-thick cladding layer was then deposited over the core and buffer layer so as to enclose all sides of the core in silicon dioxide, leaving terminal ends of the core exposed.

It will be appreciated by a person skilled in the art that numerous variations and/or modifications may be made to the present invention as shown in the specific embodiment without departing from the spirit or scope of the invention as broadly described. The present embodiments are therefore to be considered in all respects illustrative and not restrictive.

We claim:

1. A planar optical waveguide incorporating a material for producing optical amplification, wherein the material comprises aluminium oxide doped with a gain medium and is in the form of a thin film which has been formed by reactive DC sputter deposition.

2. A planar optical waveguide in accordance with claim 1, wherein the gain medium comprises one or more tanthanide species.

3. A planar optical waveguide in accordance with claim 1, wherein the medium comprises erbium.

4. A planar optical waveguide in accordance with claim 1, wherein the gain medium comprises erbium and ytterbium.

5. A planar optical waveguide in accordance with claim 1, wherein the material further comprises a gain-broadening dopant for broadening a gain spectrum of the material.

6. A planar optical waveguide in accordance with claim 1, wherein the material further comprises at least one refractive-index-modifing dopant.

7. A planar optical waveguide in accordance with claim 1, wherein the material further comprises fluorine.

8. A planar optical waveguide in accordance with claim 1, wherein the material further comprises a dopant capable of reducing interactions between atoms of the gain medium which decrease the potential gain of the material.

9. A planar optical waveguide in accordance with claim 1, wherein the material has been annealed post-deposition so as to reduce the amount of defects or impurities which could potentially cause absorption at a wavelength of a communications signal, or non-radiative energy transfer from the gain medium.

10. A planar optical waveguide in accordance with claim 1, wherein the gain medium comprises erbium at a concentration in a range between 0.05 and 0.5 atomic %.

11. A planar optical waveguide in accordance with claim 1, wherein the material is in the form of a thin film planar waveguide core which is formed on an optical buffer layer and coated with an optical cladding layer.

12. A planar optical waveguide in accordance with claim 11, wherein the buffer layer and cladding layers are silica-based.

13. A planar optical waveguide in accordance with claim 11, wherein the buffer layer and/or cladding layer comprise(s) a silica-based core of another planar waveguide.

14. A planar optical waveguide in accordance with claim 11, wherein the buffer layer and/or cladding layer comprise(s) a silica-based layer deposited by plasma-enhanced chemical vapour deposition in the absence of nitrogen or nitrogen-containing gases.

15. A planar optical waveguide in accordance with claim 1, wherein the waveguide comprises an optical amplifier for amplifying optical power when optically pumped.

16. A planar optical waveguide in accordance with claim 15, wherein the amplifier comprises a gain region of a planar waveguide laser.

17. A method of fabricating a planar waveguide amplifier for amplifying optical power when optically pumped, the method comprising:

forming an optical buffer layer on a substantially planar substrate;

forming an optically-transmissive waveguide core on the buffer layer, the core comprising aluminium oxide and a gain medium formed by reactive DC sputtering; and forming an optical cladding layer over the core.

18. A method of fabricating a planar optical waveguide in accordance with claim 17, wherein the gain medium comprises one or more lanthanide species.

19. The method of fabricating a planar optical waveguide in accordance with claim 17, wherein the gain medium comprises erbium.

20. A method of fabricating a planar optical waveguide in accordance with claims 17, wherein the step of forming the waveguide core further comprises depositing a core layer on the buffer layer and shaping the core layer into the waveguide core by means of lithographically-defined etching.

21. A method of fabricating a planar optical waveguide in accordance with claim 17, wherein step of reactive DC sputtering comprises reactive DC sputtering at least one metallic target containing aluminium in a sputtering atmosphere containing oxygen.

22. A method of fabricating a planar optical waveguide in accordance with claim 17 wherein at least one of the buffer layer and cladding layer comprise a layer of silica-based material deposited by plasma-enhanced chemical vapour deposition.

23. A method of fabricating a planar optical waveguide in accordance with claim 17, wherein at least one of the buffer layer and the cladding layer comprise a layer of silica-based material deposited by plasma-enhanced chemical vapour deposition in the absence of nitrogen or nitrogen-containing gases.

24. A method of fabricating a planar optical waveguide in accordance with claim 17, wherein at least one of the buffer layer and the cladding layer comprise a layer of silica-based material deposited by plasma-enhanced chemical vapour deposition using a liquid source of precursor.

25. A method of fabricating a planar optical waveguide in accordance with claim 24, wherein the liquid source of precursor comprises tetra ethyl oxysilane.

26. A method of fabricating a planar optical waveguide in accordance with claim 17, wherein the method further comprises annealing the core below a recrystallization temperature of the core in a manner which reduces the amount of defects and impurities which could potentially cause absorption at a wavelength of the optical signal.

27. A method of fabricating a planar optical waveguide in accordance with claim 17, wherein the method further comprises annealing the core material below a recrystallization temperature of the core in a manner which reduces the amount of defects and impurities which could potentially cause non-radiative energy transfer from excited atoms of the gain medium.

28. A method of fabricating a planar waveguide core of an amplifier for amplifying optical power when optically pumped, the method comprising:

depositing a core layer by reactive DC sputtering, the core layer comprising aluminium oxide and a gain medium; and shaping the core layer into a waveguide core by means of lithographically-defined etching.

29. A method of fabricating a planar waveguide core in accordance with claim 28, wherein a sputter target used in the DC sputtering comprises an alloy of aluminium and the gain medium.

30. A method of fabricating a planar waveguide core in accordance with claim 28, wherein a sputter target used in the DC sputtering comprises aluminium in which the gain medium is concentrated in at least one localised region.

31. A method of fabricating a planar waveguide core in accordance with 28, wherein a sputter target used in the DC sputtering comprises a laminate structure consisting of a layer of gain medium disposed directly behind and in contact with a layer of aluminium, wherein the layer of aluminium includes openings through which the layer of gain medium is exposed during the deposition, and a ratio of sputtered aluminium to sputtered gain medium in the core layer is controlled by controlling the size and number of openings in the aluminium layer.

32. A method of fabricating a planar waveguide core in accordance claim 28, wherein the DC sputtering is carried out such that there is a level of ion bombardment which is sufficient to prevent surface passivation of the gain medium within a target surface being sputtered.

33. A method of fabricating a planar waveguide core in accordance with claim 28, wherein the DC sputtering is carried out in a sputtering atmosphere containing oxygen and a noble gas, and wherein gas flows of oxygen and the noble gas during the deposition are arranged so as to reduce oxidation of a target surface being sputtered.

34. A method of fabricating a planar waveguide core in accordance with claim 33, wherein a noble-gas outlet is provided adjacent to the target surface and an oxygen outlet is provided adjacent to the substrate, so as to produce a higher partial pressure of oxygen at the substrate than at the target surface.

35. A method of fabricating a planar waveguide core in accordance with claim 28, wherein the DC sputtering is carried out in an atmosphere which contains a reactive gas capable of modifying the refractive index of the core layer.

36. A method of fabricating a planar waveguide core in accordance with claim 28 wherein the DC sputtering is carried out in an atmosphere which contains a reactive gas capable of modifying the refractive index of the core layer, and wherein the reactive gas contains fluorine.

37. A method of fabricating a planar waveguide core in accordance with claim 28, wherein the DC sputtering is carried out in an atmosphere which contains carbon tetrafluoride.

38. A method of fabricating a planar waveguide core in accordance with claim 28, wherein a sputtering target used during the DC sputtering is fluorinated during the deposition to in extent sufficient to increase a sputtering rate of the target and to incorporate fluorine in the core layer.

39. A method of fabricating a planar waveguide core in accordance with claim 38, wherein the target fluorination is carried out by cyclically flowing a fluorine-containing gas over the target and halting the flow of the fluorine-containing gas in a manner which prevents total fluorination of the target.

40. A planar optical waveguide amplifier for amplifying optical power when optically pumped, the amplifier comprising:

an optical buffer layer;

an optically-transmissive waveguide core formed on the buffer layer, the core comprising a film of material incorporating an optical gain medium and being deposited by reactive DC sputtering; and an optical cladding layer formed over the core.

41. A planar optical waveguide in accordance with claim 40, wherein the core comprises an optically-transmissive metal oxide.

42. A planar optical waveguide in accordance with claim 40, wherein the core comprises an optically-transmissive chalcogenide compound.

43. A planar optical waveguide in accordance with claim 40, wherein the core comprises aluminium oxide.

44. A planar optical waveguide in accordance with claim 40, wherein the gain medium comprises one or more lanthanide species.

45. A planar optical waveguide in accordance with claim 40, wherein the gain medium comprises erbium.

46. A planar optical waveguide in accordance with claim 40, wherein at least one of the buffer layer and cladding layer comprises a silica-based layer.

47. A planar optical waveguide in accordance with claim 40, wherein the buffer layer and/or cladding layer comprise a core of another waveguide.

* * * * *